(12) United States Patent
Yuzawa (10) Patent No.: US 7,786,598 B2
(45) Date of Patent: Aug. 31, 2010

(54) SEMICONDUCTOR CHIP AND SEMICONDUCTOR DEVICE, AND METHOD FOR MANUFACTURING SEMICONDUCTOR DEVICE

(75) Inventor: Hideki Yuzawa, Iida (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/403,421

(22) Filed: Mar. 13, 2009

(65) Prior Publication Data

US 2009/0174085 A1    Jul. 9, 2009

Related U.S. Application Data

(62) Division of application No. 11/556,224, filed on Nov. 3, 2006, now Pat. No. 7,525,200, which is a division of application No. 11/023,326, filed on Dec. 22, 2004, now Pat. No. 7,154,187.

(30) Foreign Application Priority Data

Dec. 24, 2003 (JP) .............................. 2003-427487

(51) Int. Cl.
*H01L 23/48* (2006.01)
*H01L 23/52* (2006.01)
*H01L 23/40* (2006.01)

(52) U.S. Cl. ................ 257/778; 257/693; 257/773
(58) Field of Classification Search ............. 257/693, 257/773, 778, E23.015; D13/182
See application file for complete search history.

(56) References Cited

U.S. PATENT DOCUMENTS

| 5,986,334 | A  | 11/1999 | Lee |
| 6,611,053 | B2 | 8/2003 | Akram |
| 6,782,615 | B2 | 8/2004 | Shibata et al. |
| 6,853,092 | B2 | 2/2005 | Ashida |

FOREIGN PATENT DOCUMENTS

| JP | 54-002683 | 1/1979 |
| JP | 04-352132 | 12/1992 |
| JP | 08-279535 | 10/1996 |
| JP | 2000-286291 | 10/2000 |
| JP | 2003-124318 | 4/2003 |
| JP | 2003-332380 | 11/2003 |

OTHER PUBLICATIONS

Communication from Japanese Patent Office regarding counterpart application (date not available).

*Primary Examiner*—David Vu
*Assistant Examiner*—Earl N Taylor
(74) *Attorney, Agent, or Firm*—Harness, Dickey & Pierce, P.L.C.

(57) ABSTRACT

A semiconductor chip is provided comprising a semiconductor substrate on which an integrated circuit is formed. The semiconductor chip, which is provided on the semiconductor substrate in an area array, further comprises a plurality of electrodes electrically coupled with the inside of the semiconductor substrate, wherein the electrodes are arranged into a plurality of first groups respectively lined along a plurality of paralleling first straight lines and, further, into a plurality of second groups respectively lined along a plurality of second straight lines which extend so as to intersect with the first straight lines.

1 Claim, 12 Drawing Sheets

SEMICONDUCTOR CHIP AND SEMICONDUCTOR DEVICE, AND METHOD FOR MANUFACTURING SEMICONDUCTOR DEVICE

RELATED APPLICATIONS

This application is a divisional of U.S. patent application Ser. No. 11/556,224 filed Nov. 3, 2006 which is a divisional application of U.S. patent application Ser. No. 11/023,326 filed Dec. 22, 2004 which claims priority to Japanese Patent Application No. 2003-427-487 filed Dec. 24, 2003 which are hereby expressly incorporated by reference herein in their entireties.

BACKGROUND

1. Field of the Invention

The present invention relates to a semiconductor chip and a semiconductor device, and to a method for manufacturing the semiconductor device.

2. Related Art

With a conventional semiconductor chip, the area for arranging electrodes is highly restricted, imposing restrictions on designs of integrated circuits. Accordingly, if there are fewer restrictions on the electrode arrangement area, there will be a higher degree of freedom in designing integrated circuits, and a semiconductor chip can be more reliable.

The present invention aims to provide a semiconductor chip and a semiconductor device having an excellent mountability and a high degree of freedom in designing integrated circuits, and to provide a method for manufacturing the semiconductor device.

SUMMARY

The semiconductor chip of the present invention includes:

a semiconductor substrate on which an integrated circuit is formed, and a plurality of electrodes which are provided on the semiconductor substrate in an area array and are arranged into a plurality of first groups respectively lined along a plurality of paralleling first straight lines which extend along one side of the semiconductor substrate and, further, into a plurality of second groups respectively lined along a plurality of paralleling second straight lines which extend so as to intersect with the first straight lines. According to the present invention, the electrodes of the semiconductor chip are provided in an area array. Therefore, the area in which to arrange the electrodes on the surface of the semiconductor substrate will be wider. Accordingly, there will be fewer restrictions on the electrode arrangement, thereby increasing a degree of freedom in designing integrated circuits. Further, since the electrodes are arranged into first and second groups, the wire pattern can be designed without difficulty. By the present invention, it becomes possible to provide a semiconductor chip having an excellent mountability and a high degree of freedom in designing integrated circuits.

In this semiconductor chip, the second straight line may extend diagonally from the first straight line.

In this semiconductor chip, two adjacent lines of the second straight lines may extend in parallel.

In this semiconductor chip, two adjacent lines of the second straight lines may be line symmetrical around a perpendicular line of the first straight line as an axis of symmetry.

In this semiconductor chip, the plurality of second straight lines may include a straight line A, a straight line B at a first side of the straight line A, and a straight line C at a second side of the straight line A that is opposite to the first side, and the straight line A and the straight line B may extend in parallel, and the straight line A and the straight line C may be line symmetrical around a perpendicular line of the first straight line as an axis of symmetry.

In this semiconductor chip, the second straight line extends perpendicular to the first straight line.

The semiconductor device of the present invention includes:

a substrate on which a wire pattern containing a plurality of lands is formed, and a semiconductor chip on which an integrated circuit is formed, wherein a plurality of electrodes are provided thereon in an area array and mounted on the substrate in a manner that each electrode faces any one of the lands so as to electrically couple with the land, wherein the electrodes are arranged into a plurality of first groups respectively lined along a plurality of paralleling first straight lines which extend along one side of the semiconductor chip and, further, into a plurality of second groups respectively lined along a plurality of second straight lines so as to intersect with the first straight lines, and wherein the wire pattern contains a plurality of wires which are respectively drawn out from the lands and extend so as to intersect with the first straight lines. According to the present invention, it is possible to provide a semiconductor device containing a semiconductor chip having a high degree of freedom in circuitry designing.

In this semiconductor device, the land may have an external shape expanding along the first straight line.

In this semiconductor device, the second straight line may extend diagonally from the first straight line.

In this semiconductor device, two adjacent lines of the second straight lines may extend in parallel.

In this semiconductor device, two adjacent lines of the second straight lines may be line symmetrical around the first straight line as an axis of symmetry.

In this semiconductor device, a plurality of second straight lines may include a straight line A, a straight line B at a first side of the straight line A, and a straight line C at a second side of the straight line A this is opposite to the first side, and the straight line A and the straight line B may extend in parallel, and the straight line A and the straight line C may be line symmetrical around the first straight line as an axis of symmetry.

In this semiconductor device, the second straight line may extend perpendicular to the first straight line.

In this semiconductor device, the wire of one group respectively drawn out from the land of one group that faces the electrode of an identical second group may be drawn out from one side, out of two sides, of the land of the one group along the first straight line.

In this semiconductor device, the wires drawn out from the lands of two adjacent groups of the one groups may respectively extend in opposite directions.

In this semiconductor device, the wires drawn out from the lands of two adjacent groups of the one groups may respectively extend in the same direction.

In this semiconductor device, the wire drawn out from the land that faces the electrode arranged along the straight line A may extend in an direction opposite from a direction in which the wire drawn out from the land that faces the electrode arranged along the straight line B extends and, further, in the same direction as a direction in which the wire drawn out from the land that faces the electrode arranged along the straight line C extends.

In this semiconductor device, the land of one group facing the electrode of the identical second group may project on one side, out of two sides, of the land along the first straight line so as to have a varied length, and may be formed in a manner that the projection length is greater in an order of arrangement along any second straight line.

In this semiconductor device, of the wires of one group respectively drawn out from the lands of the first group facing the electrodes of the identical second group, one of the wires drawn out from one second land of the lands having a projection length greater only than a projection length of the first land is arranged next to one of the wires drawn out from any one of the first lands in a direction in which the first land projects.

The method for manufacturing a semiconductor device according to the present invention includes:

mounting a semiconductor chip having a plurality of electrodes onto a substrate, on which a wire pattern having a plurality of lands is formed, in a manner that the electrode faces the wire pattern so that the electrode is electrically coupled with the wire pattern, arranging the electrodes, which are provided on the semiconductor chip in an area array, into a plurality of first groups respectively lined along a plurality of paralleling first straight lines which extend along one side of the semiconductor substrate and, further, into a plurality of second straight groups respectively lined along a plurality of paralleling second straight lines which extend so as to intersect with the first straight lines, arranging the lands into a plurality of third groups respectively lined along a plurality of paralleling third straight lines, wherein the wire pattern contains a plurality of wires which are respectively drawn out from the lands and extend so as to intersect with the third straight lines, and electrically coupling the electrode and the land by aligning the semiconductor chip with the substrate in a manner that the first straight line and the third straight line lie in parallel with each other so that each electrode faces any one of the lands. According to the present invention, it is possible to provide a semiconductor device containing a semiconductor chip having a high degree of freedom in circuitry designing.

DETAILED DESCRIPTION

Hereafter, embodiments of the present invention will be described with reference to the accompanying drawings. However, the present invention is not limited to the following embodiments.

First Embodiment

Figure 1:
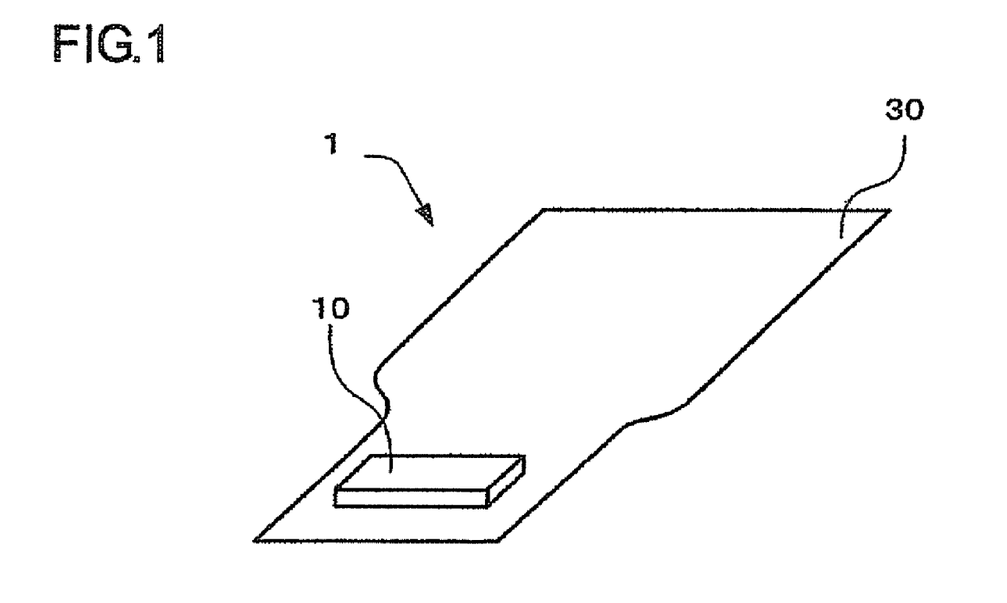
FIG. 1 is a diagram for describing the semiconductor device of a first embodiment applying the present invention.
Figure 2:
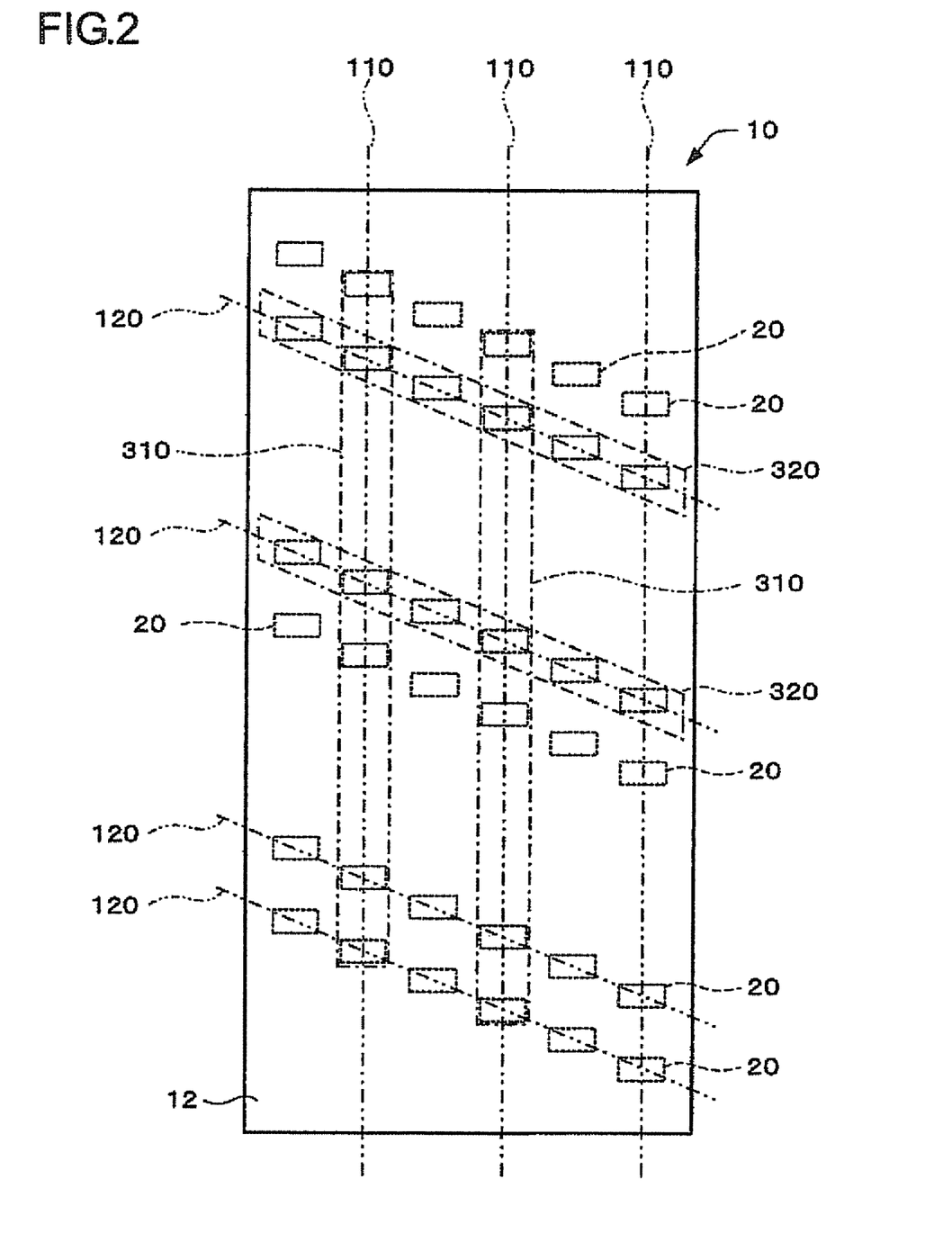
FIG. 2 is a diagram for describing the semiconductor device of the first embodiment applying the present invention.
Figure 3:
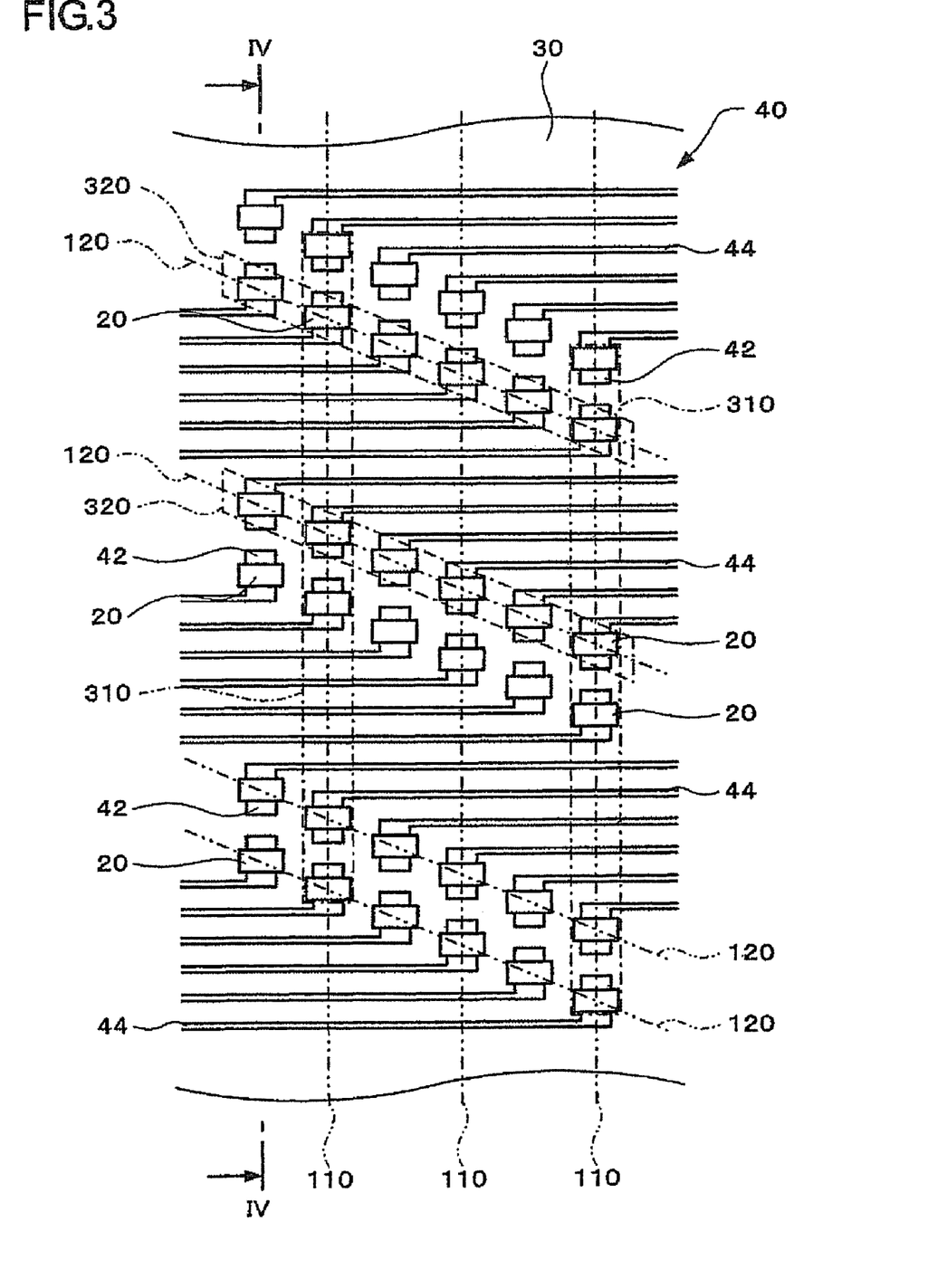
FIG. 3 is a diagram for describing the semiconductor device of the first embodiment applying the present invention.
Figure 4:
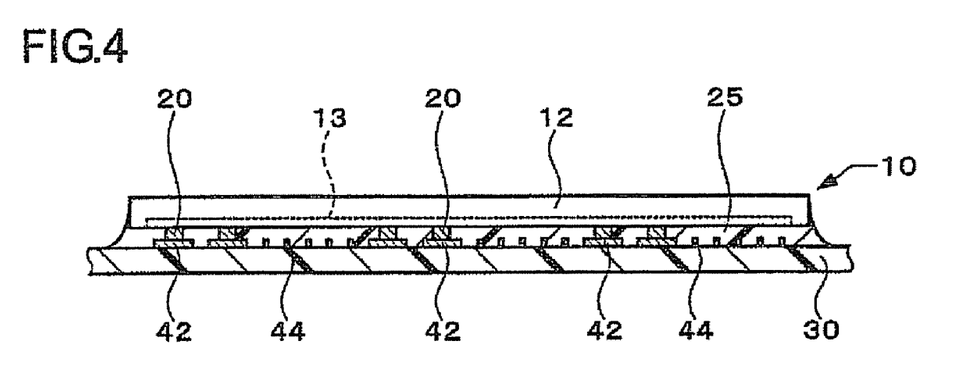
FIG. 4 is a diagram for describing the semiconductor device of the first embodiment applying the present invention.

From FIG. 1 to FIG. 4 are diagrams for describing the semiconductor device of a first embodiment applying the present invention. More precisely, FIG. 1 is a diagram outlining a semiconductor device 1 of the embodiment applying the present invention. Further, FIG. 2 is a diagram showing a semiconductor chip 10. FIG. 3 is a partially enlarged diagram of the semiconductor device 1. However, in FIG. 3, a semiconductor substrate 12 is omitted for the convenience of describing a coupling situation between an electrode 20 and a land 42. Further, FIG. 4 is a cross-sectional view taken along a line IV-IV of FIG. 3.

The semiconductor device of the present embodiment includes, as shown in FIG. 1, the semiconductor chip 10. The semiconductor chip 10 includes, as shown in FIG. 2, the semiconductor substrate 12. In addition, FIG. 2 is a diagram illustrating a configuration observed from an opposite side of the surface (active surface) of the semiconductor chip 10 on which the electrode 20 is formed. Although the external shape of the semiconductor chip 10 is not limited to any particular shape, it may be rectangular as shown in FIG. 2. On the semiconductor substrate 12, an integrated circuit 13 is formed (see FIG. 4). The composition of the integrated circuit 13 is not limited to a particular composition; however, the circuit 13 may be composed of a transistor or a memory element.

The semiconductor chip 10 contains a plurality of electrodes 20 as shown in FIG. 2. The electrode 20 is provided on the semiconductor substrate 12. The electrode 20 may be electrically coupled with the inside of the semiconductor substrate 12. Here, all electrodes 20 may be electrically coupled with the inside of the semiconductor substrate 12. Possibly, an electrode that is not electrically coupled with the inside of the semiconductor substrate 12 may also be called as the electrode 20. The electrode 20 may be electrically coupled with the integrated circuit 13. Possibly, an electrode that is not electrically coupled with the integrated circuit 13 may also be called as the electrode 20. The electrode 20 may include a pad and a bump provided on the pad (not shown). In the present embodiment, as shown in FIG. 2, the electrodes 20 are provided in an area array. Since the electrodes 20 are provided in an area array, the area in which to arrange the electrodes 20 on the semiconductor substrate 12 will be wider. Because of this, there will be fewer restrictions on the arrangement of the electrodes 20, thereby increasing a degree of freedom in designing the integrated circuit 13. Further, as shown in FIG. 2, the electrodes 20 are arranged into a plurality of first groups 310 respectively lined along a plurality of paralleling straight lines 110. Also, as shown in FIG. 2, the first straight line 110 is a straight line extending along one side of the semiconductor substrate 12. In addition, as shown in FIG. 2, the electrodes 20 are arranged into a plurality of second groups 320 respectively lined along a plurality of second straight lines 120 which extend so as to intersect with the first straight lines 110. As shown in FIG. 2, the second straight line 120 may extend diagonally from the first straight line 110. Also, two adjacent second straight lines 120 may extend in parallel. Here, all the second straight lines 120 may extend in parallel. In the present embodiment, because the electrodes 20 are arranged into the first and second groups 310 and 320, the wire pattern of the substrate for packaging the semiconductor chip 10 can be designed without difficulty. That is, the wire pattern can be readily designed in such a manner that the wire pattern does not contact an electrode 20 that is not the object electrode, and, thus, mountability of the semiconductor chip 10 can be enhanced.

The semiconductor chip 10 may further contain a composition of a well-known semiconductor chip such as a passivation layer or an inter-layer insulating film (not shown). Further, as shown in FIG. 1, the semiconductor chip 10 is mounted on the substrate 30. The semiconductor chip 10 is mounted on the substrate 30 in a manner that the electrode 20 faces the land 42 of a wire pattern 40 (see FIGS. 3 and 4).

The semiconductor device of the present embodiment contains the substrate 30 as shown in FIG. 1. The material for the substrate 30 is not limited to any particular material but may be organic (e.g., an epoxy substrate) or inorganic (e.g., a ceramic substrate or a glass substrate), or may have a compound structure thereof (e.g., a glass-epoxy substrate). The substrate 30 may be a rigid substrate. Alternatively, the substrate 30 may be a flexible substrate such as a polyester substrate or a polyimide substrate. The substrate 30 may be a substrate used for a chip on film (COF). Further, the substrate 30 may be a single-layered substrate made of a single layer or a multi-layered substrate having a plurality of laminated layers. Additionally, the shape or the thickness of the substrate 30 is not limited to any particular shape or thickness.

As shown in FIG. 3, the substrate 30 includes the wire pattern 40. Incidentally, FIG. 3 is a partially enlarged view of the semiconductor device 1. In FIG. 3, however, the semiconductor substrate 12 is omitted for the convenience of explaining a coupling situation between the electrode 20 and the land 42. The wire pattern 40 may be formed by laminating, or by using a single layer of, any of copper (Cu), chromium (Cr), titan (Ti), nickel (Ni), titan-tungsten (Ti—W), gold (Au), aluminum (Al), nickel vanadium (NiV), and tungsten (W). If a multilayered substrate is prepared for use as the substrate 30, the wire pattern 40 may be provided between each layer. Further, if a glass substrate is used as the substrate 30, the wire pattern 40 may be formed with a metal layer, or a metal-compound layer, of indium tin oxide (ITO), Cr, or Al, for example, or with a layer mixing such a metal layer and a metal-compound layer. The method for forming the wire pattern 40 is not limited to any particular method. The wire pattern 40 may be formed by sputtering, for example, or by employing an additive process in which the wire pattern 40 is formed by electroless plating. Further, the wire pattern 40 may be plated with solder, tin, gold, or nickel, for example.

The wire pattern 40 contains a plurality of lands 42. The land 42 is the part that faces the electrode 20 of the semiconductor chip 10 so as to electrically couple with the electrode 20. As shown in FIG. 3, the land 42 may be arranged so as to face the electrode 20. The lands 42 may be aligned to be separated into groups along the first straight lines 110 and into groups along the second straight lines 120. As shown in FIG. 3, the land 42 may have an external shape expanding along the first straight line 110. Further, all the lands 42 may be formed to have the same size. The wire pattern 40 contains, as shown in FIG. 3, a plurality of wires 44 which are respectively drawn out from the lands 42 and extend so as to intersect with the first straight lines 110. As shown in FIG. 3, the wire 44 of one group respectively drawn out from the land 42 of one group that faces the electrode 20 of an identical second group 320 may be drawn out from one side, out of two sides, of the land 42 along the first straight line 110. Further, as shown in FIG. 3, the wires 44 drawn out from the lands 42 that face the electrodes 20 of two adjacent second groups 320 may respectively extend in opposite directions.

In the semiconductor device of the present embodiment, the semiconductor chip 10 is mounted on the substrate 30 as shown in FIG. 1. As shown in FIG. 3 or FIG. 4, the semiconductor chip 10 is mounted in a manner that the electrode 20 faces the land 42. Further, the electrode 20 and the land 42 are electrically coupled. By electrically coupling the electrode 20 with the land 42, the electrode 20 and the wire pattern 40 are electrically coupled. The electrical coupling of the electrode 20 and the land 42 may be conducted by having them in contact with one another as shown in FIG. 4. Alternatively, the electrical coupling of the electrode 20 and the land 42 may be carried out by intervening conductive particles between the electrode 20 and the land 42 (not shown). Alternatively, for the electrical coupling of the electrode 20 and the land 42, an alloy junction (e.g., an Au—Au or an Au—Sn junction) may be used.

As shown in FIG. 4, the semiconductor device of the embodiment applying the present invention may further include a reinforcement part 25 for adhering the semiconductor chip 10 to the substrate 30. The reinforcement part 25 can further increase reliability of the semiconductor device. The material of the reinforcement part 25 may be resin but is not limited thereto.

The semiconductor device of the present embodiment is composed as hereinbefore described. The method for manufacturing the semiconductor device will be described as follows.

The method for manufacturing the semiconductor device of the present embodiment includes electrically coupling the electrode 20 with the wire pattern 40 by mounting the semiconductor chip 10 having a plurality of electrodes 20 onto the substrate 30, on which the wire pattern 40 having a plurality of lands 42 is formed, in a manner that the electrode 20 faces the wire pattern 40. The process thereof is described in the following.

The present process may include preparing the semiconductor chip 10 (see FIG. 2). The semiconductor chip 10 contains a plurality of electrodes 20. The electrodes 20 are provided on the semiconductor chip 10 in an area array. The electrodes 20 are arranged into a plurality of first groups 310 respectively lined along a plurality of paralleling first straight lines 110. The first straight line 110 is a straight line that extends along one side of the semiconductor chip 10. Further, the electrodes 20 are arranged into a plurality of second groups 320 respectively lined along a plurality of second straight lines 120 which extend so as to intersect with the first straight lines 110.

Figure 5:
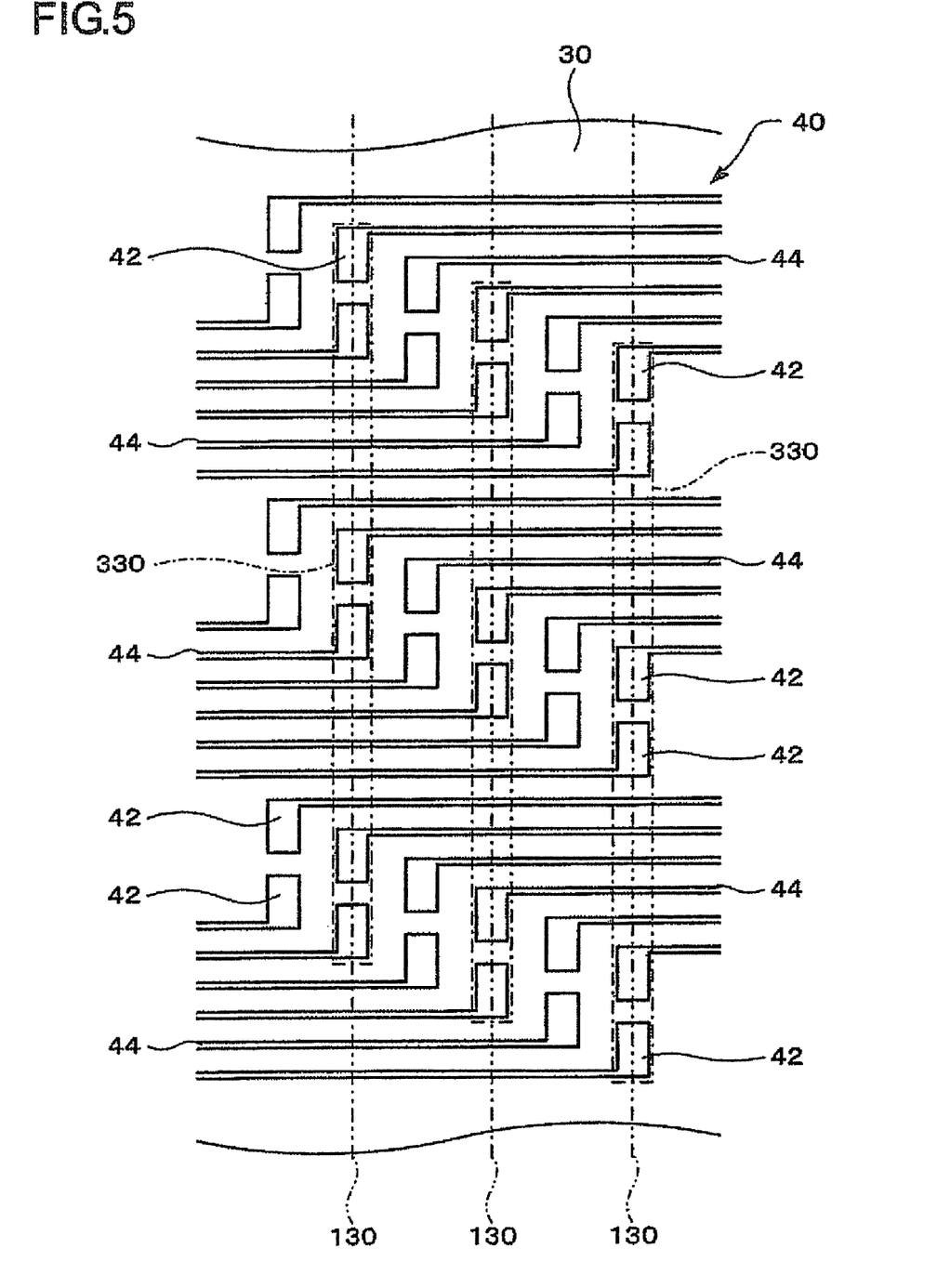
FIG. 5 is a diagram for describing the method for manufacturing the semiconductor device of the first embodiment applying the present invention.

As shown in FIG. 5, the present process may include preparing the substrate 30. As shown in FIG. 5, on the substrate 30, the wire pattern 40 having a plurality of leads 42 is formed. The lands 42 are arranged into a plurality of third groups 330 respectively lined along a plurality of paralleling third straight lines 130. In addition, the wire pattern 40 contains a plurality of wires 44 which are respectively drawn out from the lands 42 and extend so as to intersect with the third straight lines 130.

The present process includes aligning the semiconductor chip 10 with the substrate 30 so that the first straight line 110 and the third straight line 130 lie in parallel with each other and so that the electrode 20 faces the land 42 (see FIG. 3). The electrode 20 of one first group 310 may face the land 42 of any one third group 330. Thus, the electrode 20 and the land 42 are electrically coupled. To electrically couple the electrode 20 with the land 42, any well-known method may be employed. By electrically coupling the electrode 20 with the land 42, the electrode 20 and the wire pattern 40 may be electrically coupled.

Additionally, the semiconductor device 1 may be manufactured after carrying out a process such as forming the reinforcement part 25 for adhering the semiconductor chip 10 to the substrate 30 (see FIG. 1).

Second Embodiment

Figure 6:
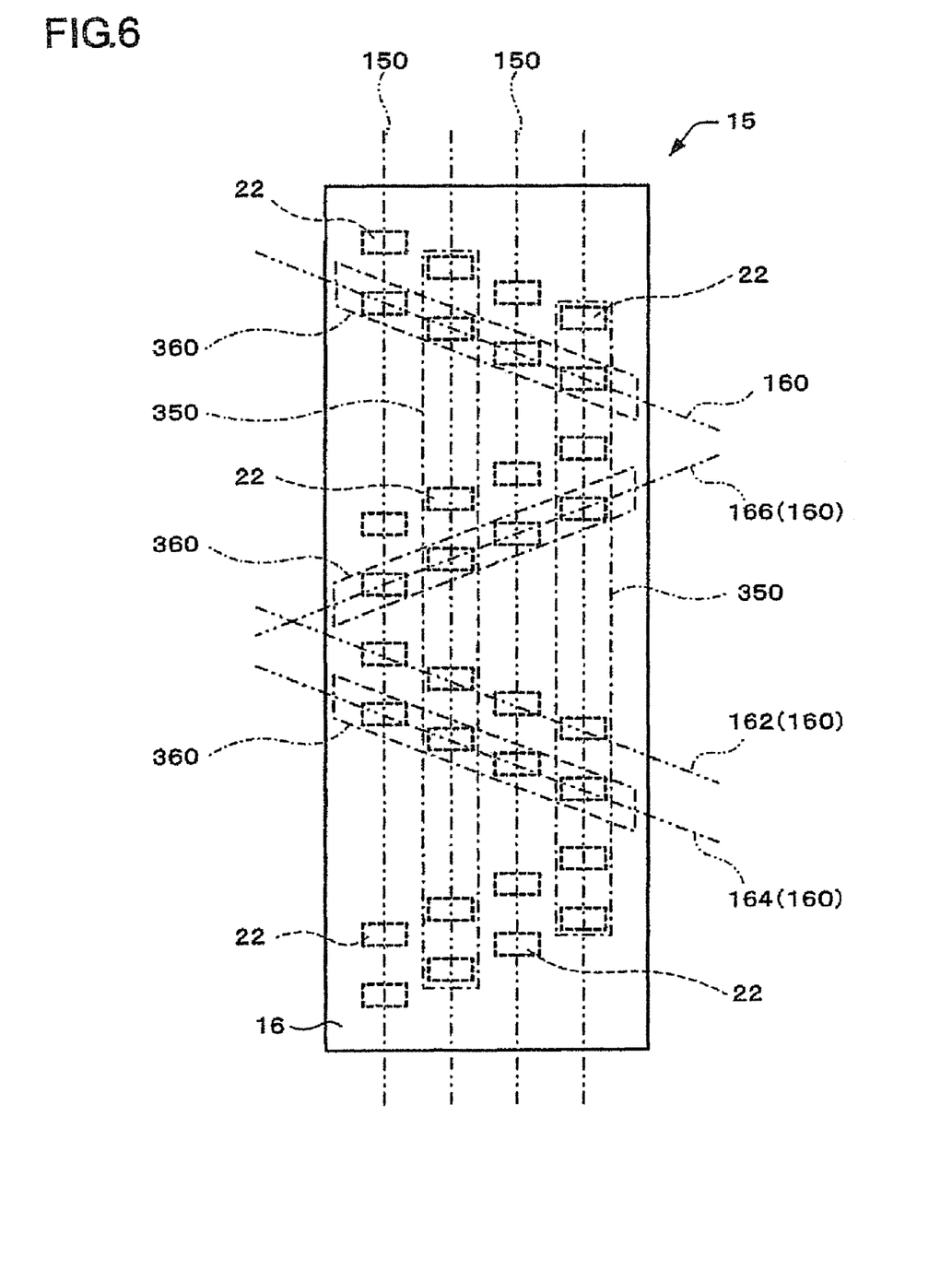
FIG. 6 is a diagram for describing the semiconductor device of a second embodiment applying the present invention.
Figure 7:
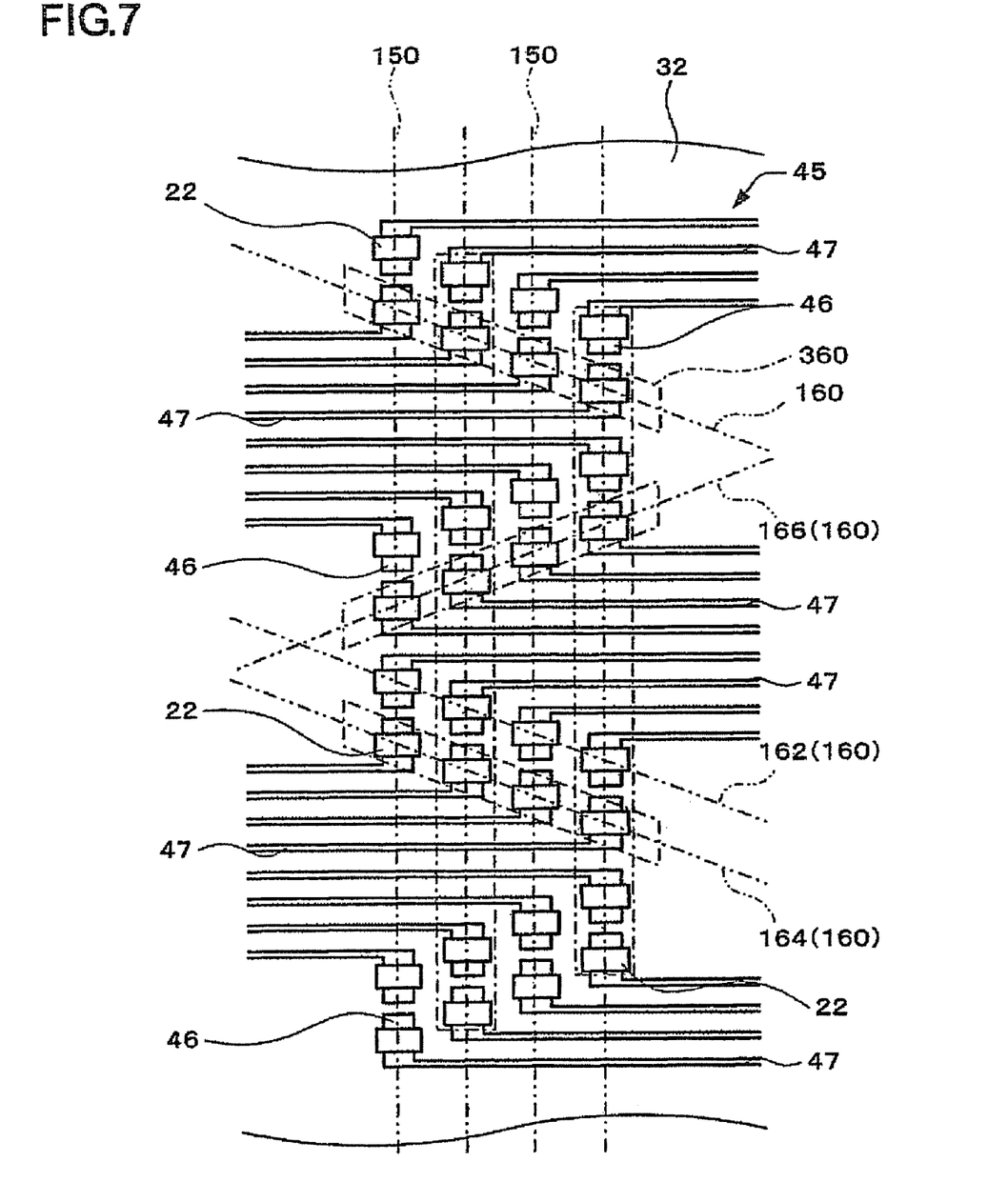
FIG. 7 is a diagram for describing the semiconductor device of the second embodiment applying the present invention.

FIGS. 6 and 7 are diagrams for describing the semiconductor device of a second embodiment applying the present invention. Further, in the semiconductor device of the present embodiment, also, descriptions already given above shall be employed wherever applicable.

The semiconductor device of the present embodiment includes a semiconductor chip 15. FIG. 6 is a diagram for describing the semiconductor chip 15. The semiconductor chip 15 contains a semiconductor substrate 16 and a plurality of electrodes 22 provided on the semiconductor substrate 16 in an area array. As shown in FIG. 6, the electrodes 22 are arranged into a plurality of groups 350 respectively lined along a plurality of paralleling first straight lines 150 which extend along one side of the semiconductor substrate 16. Also, as shown in FIG. 6, the electrodes 22 are arranged into a plurality of second groups 360 respectively lined along a plurality of second straight lines 160 which extend so as to intersect with the first straight lines 150. The second straight line 160 extends diagonally from the first straight line 150. Further, in the semiconductor device of the present embodiment, the second straight lines 160 include a straight line A 162, a straight line B 164 arranged on a first side of the straight line A 162, and a straight line C 166 arranged on a second side of the straight line A that is opposite to the first side. As shown in FIG. 6, the straight line A 162 and the straight line B 164 extend in parallel. Further, as shown in FIG. 6, the straight line A 162 and the straight line C 166 are line symmetrical around a perpendicular line of the first straight line 150 as the axis of symmetry.

The semiconductor device of the present embodiment comprises a substrate 32 having a wire pattern 45 containing a plurality of lands 46 (see FIG. 7). On the substrate 32, the semiconductor chip 15 is mounted. Further, FIG. 7 is a partially enlarged diagram of the semiconductor device of the present embodiment, illustrated for describing a coupling situation of the electrode 22 and the land 46. However, in FIG. 7, the semiconductor substrate 16 is omitted for the convenience of explaining the coupling situation between the electrode 22 and the land 46. In addition, as shown in FIG. 7, the land 46 is arranged so as to face the electrode 22.

As shown in FIG. 7, the wire pattern 45 includes a plurality of wires 47 which are respectively drawn out from the lands 46 and extend so as to intersect with the first straight lines 150. As shown in FIG. 7, the wire 47 of one group respectively drawn out from the land 46 that faces the electrode 22 of an identical second group 360 may be drawn out from one side, out of two sides, of the land 46 along the first straight line 150. As described earlier, the second straight lines 160 include the straight line A 162, the straight line B 164, and the straight line C 166. Additionally, as shown in FIG. 7, the wire 47 drawn out from the land 46 that faces the electrode 22 arranged along the straight line A 162 may respectively extend in a direction opposite from a direction in which the wire 47 drawn out from the land 46 that faces the electrode 22 arranged along the straight line B 164 extends. Moreover, the wire 47 drawn out from the land 46 that faces the electrode 22 arranged along the straight line A 162 may extend in the same direction as the direction in which the wire 47 drawn out from the land 46 that faces the electrode 22 arranged along the straight line C 166 extends.

Third Embodiment

Figure 8:
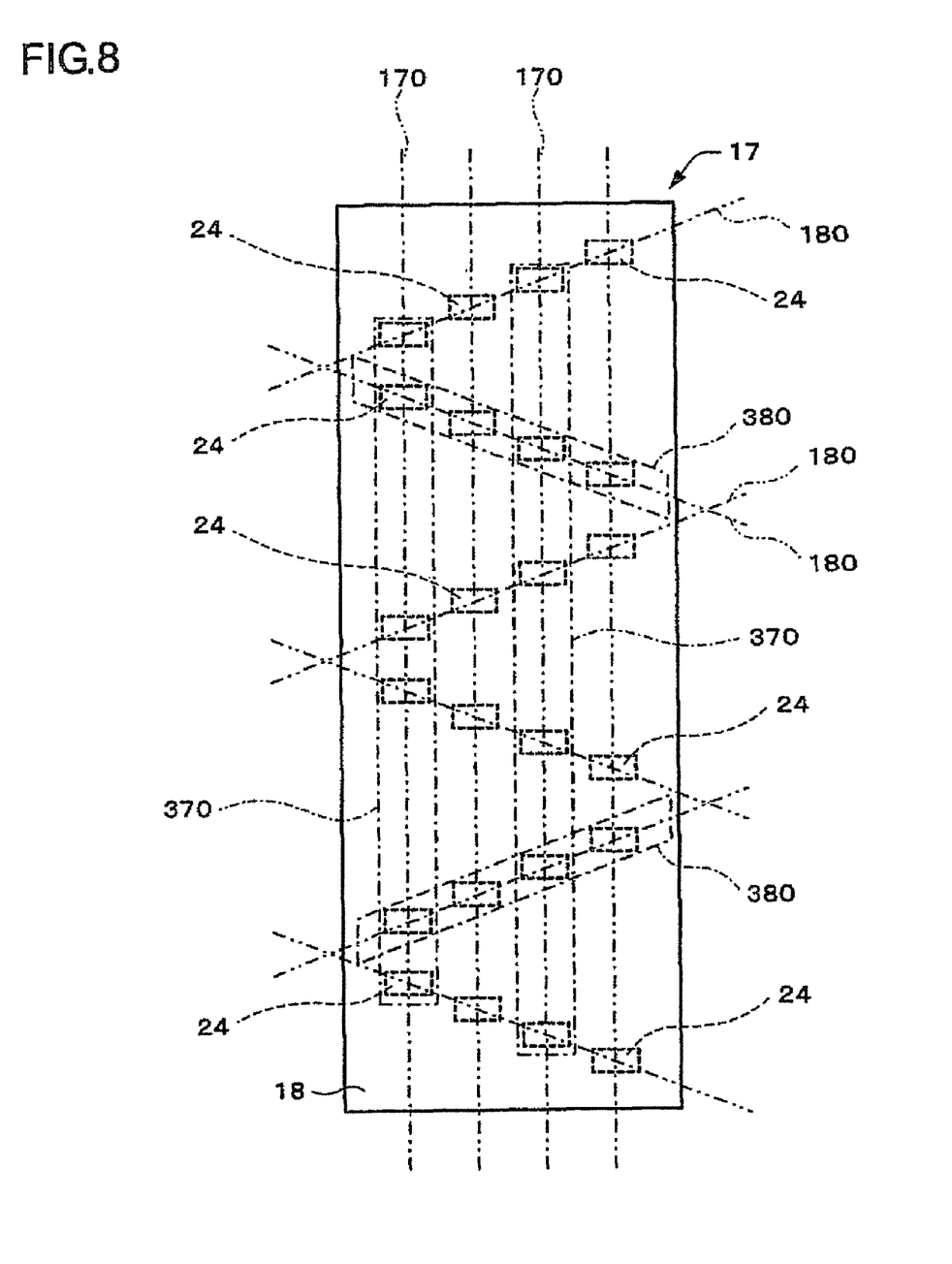
FIG. 8 is a diagram for describing the semiconductor device of a third embodiment applying the present invention.
Figure 9:
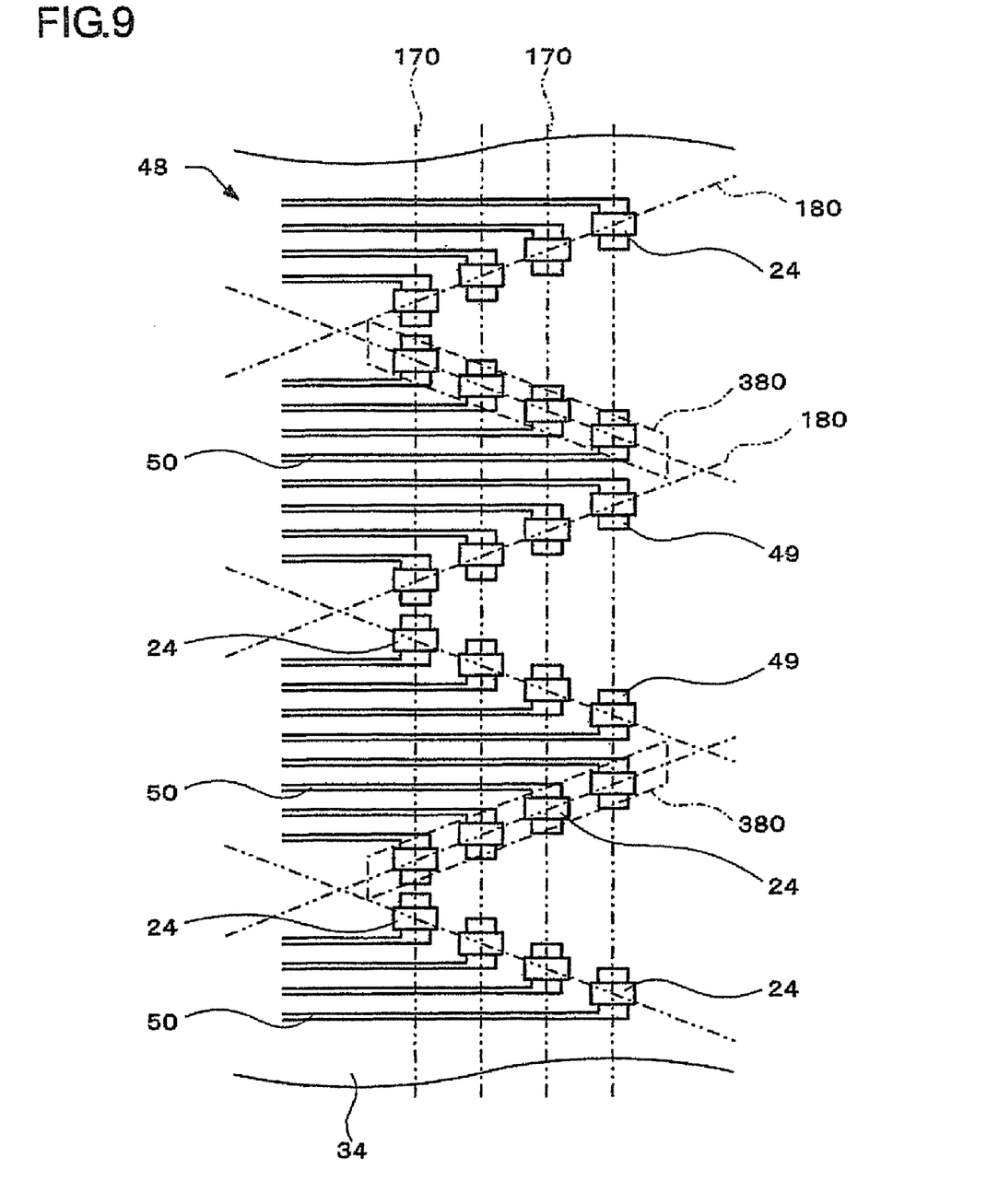
FIG. 9 is a diagram for describing the semiconductor device of the third embodiment applying the present invention.

FIGS. 8 and 9 are diagrams for describing the semiconductor device of a third embodiment applying the present invention. Further, in the semiconductor device of the present embodiment, also, descriptions already given above shall be employed wherever applicable.

The semiconductor device of the present embodiment includes a semiconductor chip 17. FIG. 8 is a diagram for describing the semiconductor chip 17. The semiconductor chip 17 includes a semiconductor substrate 18 and a plurality of electrodes 24 provided on the semiconductor substrate 18 in an area array. As shown in FIG. 8, the electrodes 24 are arranged into a plurality of first groups 370 respectively lined along a plurality of paralleling first straight lines 170 which extend along one side of the semiconductor substrate 18. Also, as shown in FIG. 8, the electrodes 24 are arranged into a plurality of second groups 380 respectively lined along a plurality of second straight lines 180 which extend so as to intersect with the first straight lines 170. The second straight line 180 extends diagonally from the first straight line 170. Further, in the semiconductor device of the present embodiment, two adjacent second straight lines 180 are line symmetrical around the first straight line 170 as the axis of symmetry.

The semiconductor device of the present embodiment comprises a substrate 34 having a wire pattern 48 containing a plurality of lands 49 (see FIG. 9). FIG. 9 is a partially enlarged diagram illustrating the semiconductor device of the present embodiment. On the substrate 34, the semiconductor chip 17 is mounted. Further, as shown in FIG. 9, the land 49 is arranged so as to face the electrode 24.

As shown in FIG. 9, the wire pattern 48 includes a plurality of wires 50 which are respectively drawn out from the lands 49 and extend so as to intersect with the first straight lines 170. As shown in FIG. 9, the wire 50 of one group drawn out from the land 49 that faces the electrode 24 of an identical second group 380 may be drawn out from one side, out of two sides, of the land 49 along the first straight line 170. Further, as shown in FIG. 9, the wires 50 drawn out from the lands 49 that face the electrodes 24 of two adjacent second groups may respectively extend in the same direction. Here, all wires 50 may extend in the same direction.

Fourth Embodiment

Figure 10:
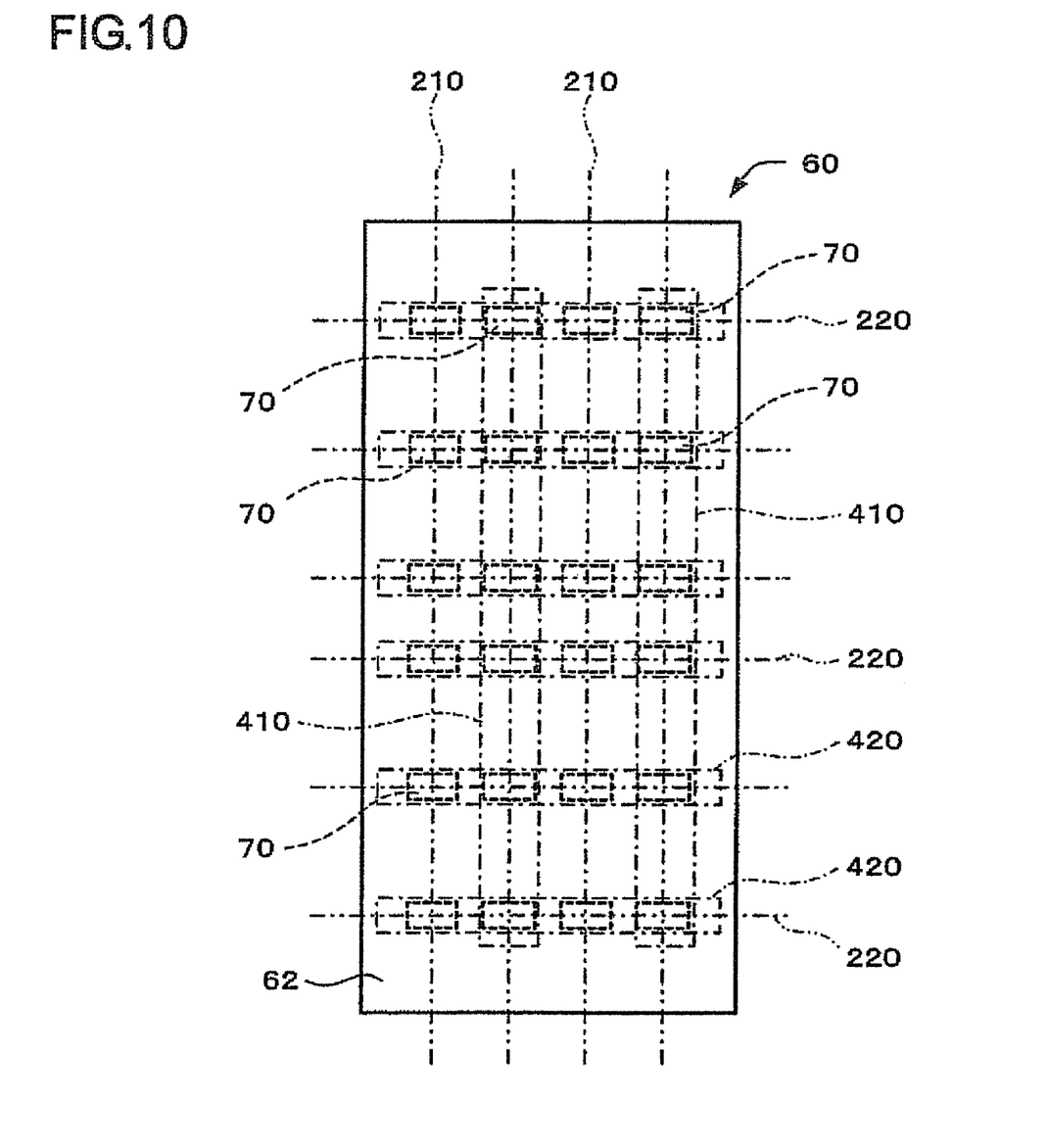
FIG. 10 is a diagram for describing the semiconductor device of a fourth embodiment applying the present invention.
Figure 11:
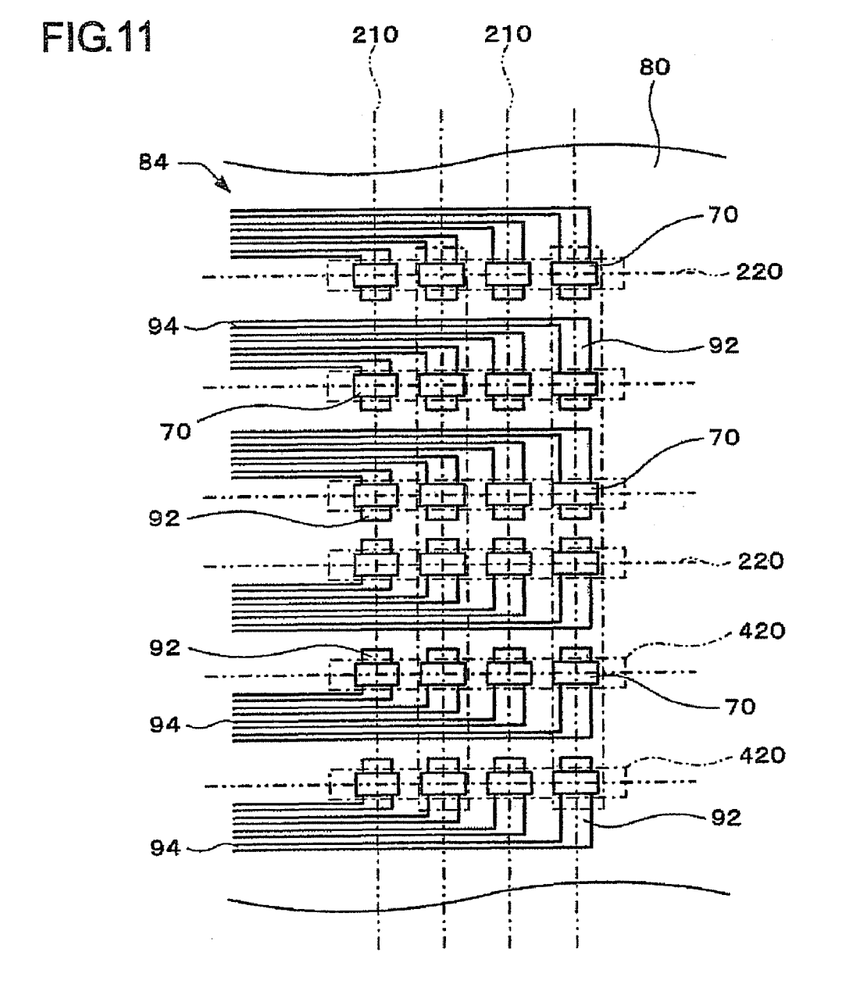
FIG. 11 is a diagram for describing the semiconductor device of the fourth embodiment applying the present invention.

FIGS. 10 and 11 are diagrams for describing the semiconductor device of a fourth embodiment applying the present invention. Further, in the semiconductor device of the present embodiment, also, descriptions already given above shall be employed wherever applicable.

The semiconductor device of the present embodiment includes a semiconductor chip 60. FIG. 10 is a diagram for describing the semiconductor chip 60. The semiconductor chip 60 contains a semiconductor substrate 62 and a plurality of electrodes 70 provided on the semiconductor substrate 62 in an area array. As shown in FIG. 10, the electrodes 70 are arranged into a plurality of first groups 410 respectively lined along a plurality of paralleling first straight lines 210 which extend along one side of the semiconductor substrate 62. Also, as shown in FIG. 10, the electrodes 70 are arranged into a plurality of second groups 420 respectively lined along a plurality of second straight lines 220 which extend so as to intersect with the first straight lines 210. Further, as shown in FIG. 10, the second straight line 220 extends perpendicular to the first straight line 210.

The semiconductor device of the present embodiment comprises a substrate 80 having a wire pattern 84 containing a plurality of lands 92 (see FIG. 11). FIG. 11 is a partially enlarged diagram illustrating the semiconductor device of the present embodiment. On the substrate 80, the semiconductor chip 60 is mounted. Further, the land 92 is arranged so as to face the electrode 70. As shown in FIG. 11, the land 92 of one group facing the electrode 70 of an identical second group 420 may project on one side, out of two sides, of the land 92 along the first straight line 210 so as to have a varied length and may be formed in a manner that the projection length is greater in an order of arrangement along any second straight line 220.

As shown in FIG. 11, the wire pattern 84 includes a plurality of wires 94 which are respectively drawn out from the lands 92 and extend so as to intersect with the first straight lines 210. As shown in FIG. 11, the wire of one group respectively drawn out from the land 92 that faces the electrode 70 of an identical second group 420 may be drawn out from one side, out of two sides, of the land 92 along the first straight line 210. Further, of the wires of one group respectively drawn out from the lands 92 of the first group facing the electrodes 70 of the identical second group 420, one wire 94 drawn out from one second land having a projection length greater only than that of a first land is arranged next to the one wire 94 drawn out from any one first land in a direction in which the first land projects.

Figure 12:
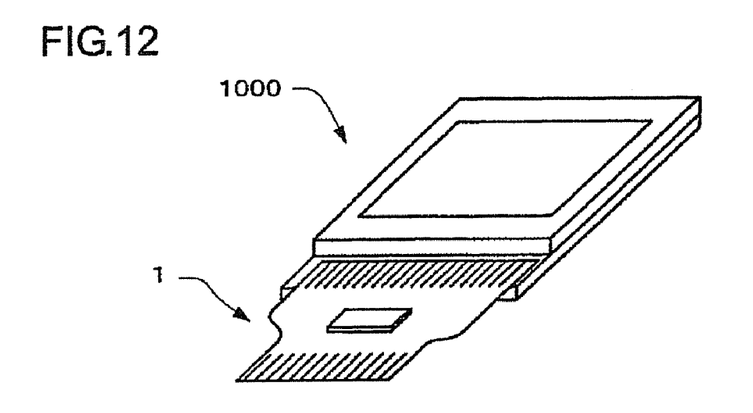
FIG. 12 is a diagram illustrating a display device containing the semiconductor device of the embodiments applying the present invention.
Figure 13:
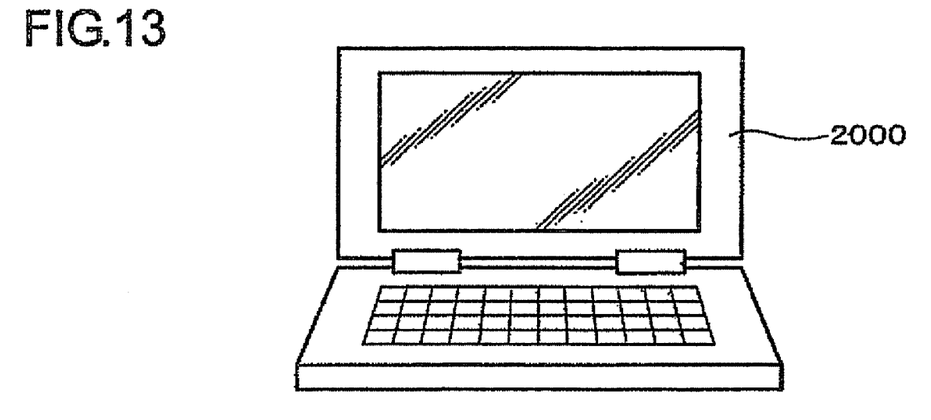
FIG. 13 is a diagram illustrating an electronic apparatus containing the semiconductor device of the embodiments applying the present invention.
Figure 14:
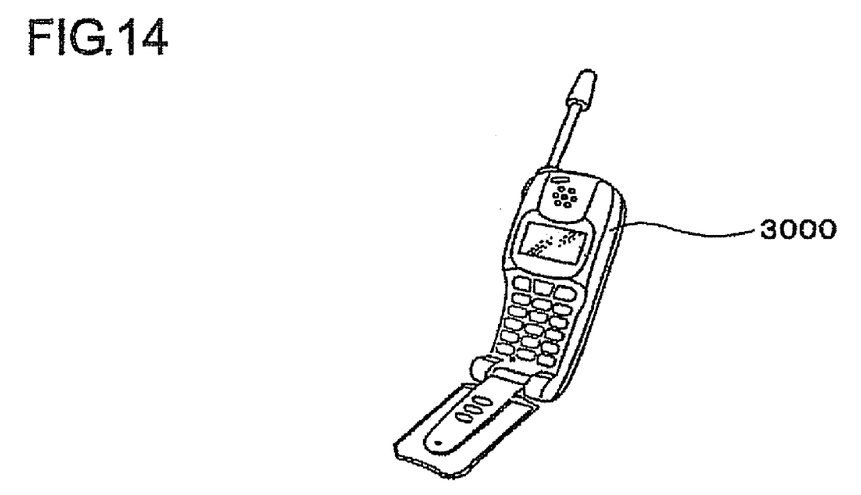
FIG. 14 is a diagram illustrating an electronic apparatus containing the semiconductor device of the embodiments applying the present invention.

FIG. 12 illustrates a display device 1000 containing the semiconductor device of the embodiments applying the present invention. The display device 1000 may be a liquid-crystal display device or an electrical luminescence (EL) display device, for example. Further, as electronic apparatuses containing the semiconductor device 1, a notebook-sized personal computer 2000 and a mobile telephone 3000 are shown in FIGS. 13 and 14, respectively.

Further, according to the present invention, embodiments of the present invention are not limited to the above-described embodiments but can have various alternatives. That is, the present invention includes compositions which are, in substance, the same as the compositions described in the embodiments (such as a composition having the same function, method, and result, or a composition having the same object and effect). Further, the present invention includes compositions in that non-essential elements of the compositions described in the embodiments are replaced with other elements. Furthermore, the present invention includes compositions that exert the same operational effects as with the compositions described in the embodiments. Moreover, the present invention includes techniques well known in the art in addition to the compositions as described in the embodiments.

What is claimed is:

1. A semiconductor device comprising:
   a substrate;
   a plurality of wires provided on said substrate, each of said wires having an elongated portion and a land portion that extends from said elongated portion at approximately a right angle, each of said elongated portions arranged in parallel to each other;
   a semiconductor chip mounted on said substrate;
   a plurality of electrodes mounted to said semiconductor chip, each of said electrodes positioned opposite to said lands to electrically couple said electrodes and said lands;
   a first array of said wires in electrical contact with a first array of said electrodes, said first array of said electrodes arranged along a first straight line;
   a second array of said wires in electrical contact with a second array of said electrodes, said second array of said electrodes arranged along a second straight line;
   a third array of said wires in electrical contact with a third array of said electrodes, said third array of said electrodes arranged along a third straight line; and
   a fourth array of said wires in electrical contact with a fourth array of said electrodes, said fourth array of said electrodes arranged along a fourth straight line;
   wherein said first straight line is parallel to said third straight line and said second straight line is parallel to said fourth straight line, said first straight line and said third straight line each intersect said second straight line and said fourth straight line;
   wherein said first straight line, said second straight line, said third straight line, and said fourth straight line are each angled at a non-right angle relative to a first side of said substrate and a second side of said substrate that is opposite to said first side;
   wherein said elongated portions of each of said first array of said wires, said second array of said wires, said third array of said wires, and said fourth array of said wires extend to said first side of said substrate, said elongated portions of each of said first array of said wires, said second array of said wires, said third array of said wires, and said fourth array of said wires having progressively increased lengths and not crossing each other;
   wherein a first one of said electrodes from each of said first array of electrodes, said second array of electrodes, said third array of electrodes, and said fourth array of electrodes are arranged along a fifth straight line that is parallel to said first side of said substrate and said second side of said substrate, said elongated portions of said wires intersect said fifth straight line;
   wherein a second one of said electrodes from each of said first array of electrodes, said second array of electrodes, said third array of electrodes, and said fourth array of electrodes are arranged along a sixth straight line that is parallel to said fifth straight line;
   wherein each of said first, second, third, and fourth straight lines are angled at a non-right angle relative to said fifth straight line and said sixth straight line; and
   wherein each of said lands extend from said wires in a direction parallel to said fifth straight line and said sixth straight line.

* * * * *